US010490979B2

United States Patent
Hashimoto et al.

(10) Patent No.: US 10,490,979 B2
(45) Date of Patent: Nov. 26, 2019

(54) SUBSTRATE INCLUDING PHOTONIC CRYSTAL AND METHOD FOR MANUFACTURING THE SAME, AND SURFACE EMITTING QUANTUM CASCADE LASER

(71) Applicant: Kabushiki Kaisha Toshiba, Minato-ku (JP)

(72) Inventors: Rei Hashimoto, Edogawa (JP); Shinji Saito, Yokohama (JP); Tsutomu Kakuno, Fujisawa (JP); Kei Kaneko, Yokohama (JP); Yasunobu Kai, Yokohama (JP); Naotada Okada, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/855,413

(22) Filed: Dec. 27, 2017

(65) Prior Publication Data
US 2019/0199064 A1 Jun. 27, 2019

(51) Int. Cl.
*H01S 5/34* (2006.01)
*H01S 5/12* (2006.01)
(Continued)

(52) U.S. Cl.
CPC ........ *H01S 5/3402* (2013.01); *H01L 21/0242* (2013.01); *H01L 21/0254* (2013.01);
(Continued)

(58) Field of Classification Search
CPC ............. H01S 5/18–187; H01S 5/3402; H01S 5/18319; H01S 5/3401; H01S 5/3418; H01S 5/3419
See application file for complete search history.

(56) References Cited

U.S. PATENT DOCUMENTS 3,982,261 A * 9/1976 Antypas .................... H01J 1/34
372/44.01
9,893,493 B2 * 2/2018 Saito .................... H01S 5/3402
(Continued)

FOREIGN PATENT DOCUMENTS

JP 2004-14796 A 1/2004
JP 2006-114829 4/2006
(Continued)

OTHER PUBLICATIONS

Matsubara et al. ("GaN photonic-crystal surface-emitting laser at blue-violet wavelengths", Science, vol. 319, Jan. 25, 2008, pp. 445-447 along with supplemental content) (Year: 2008).*

*Primary Examiner* — Tod T Van Roy
(74) *Attorney, Agent, or Firm* — Oblon, McClelland, Maier & Neustadt, L.L.P.

(57) ABSTRACT

A substrate including a photonic crystal has a compound semiconductor, dielectric layers, and a first semiconductor layer. The dielectric layers are provided on a surface of the compound semiconductor substrate and disposed at each grating point of a two-dimensional diffraction grating, each of the dielectric layers having an asymmetric shape in relation to at least one edge of the two-dimensional diffraction grating and having a refractive index lower than a refractive index of the compound semiconductor substrate. The first semiconductor layer includes a flat first face covering the dielectric layers and the surface of the compound semiconductor substrate, a layer constituting the first face containing a material capable of being lattice matched to a material constituting the compound semiconductor substrate.

4 Claims, 13 Drawing Sheets

(51) Int. Cl.
*H01L 33/00* (2010.01)
*H01L 21/02* (2006.01)
*H01S 5/183* (2006.01)
*H01S 5/10* (2006.01)
*H01S 5/18* (2006.01)
*H01S 5/343* (2006.01)

(52) U.S. Cl.
CPC .. *H01L 21/02433* (2013.01); *H01L 21/02458* (2013.01); *H01L 21/02642* (2013.01); *H01L 33/007* (2013.01); *H01S 5/105* (2013.01); *H01S 5/124* (2013.01); *H01S 5/1231* (2013.01); *H01S 5/183* (2013.01); *H01S 5/3401* (2013.01); *H01L 21/02392* (2013.01); *H01L 21/02395* (2013.01); *H01L 21/02461* (2013.01); *H01L 21/02463* (2013.01); *H01L 21/02488* (2013.01); *H01L 21/02513* (2013.01); *H01L 21/02543* (2013.01); *H01L 21/02546* (2013.01); *H01L 21/02639* (2013.01); *H01L 21/02647* (2013.01); *H01S 5/18* (2013.01); *H01S 5/34313* (2013.01)

(56) References Cited

U.S. PATENT DOCUMENTS

| | | | |
|---|---|---|---|
| 2006/0084245 | A1 | 4/2006 | Kohda |
| 2010/0284432 | A1* | 11/2010 | Hoshino ............ H01S 5/18308 372/44.011 |
| 2014/0241392 | A1 | 8/2014 | Edamura et al. |
| 2016/0020576 | A1* | 1/2016 | Watanabe ............ G02F 1/3558 359/328 |
| 2016/0276806 | A1* | 9/2016 | Ohira ................. H01S 5/18361 |

FOREIGN PATENT DOCUMENTS

| | | |
|---|---|---|
| JP | 2007-335686 A | 12/2007 |
| JP | 2008-140917 A | 6/2008 |
| JP | 2009-111167 | 5/2009 |
| JP | 2009-231773 A | 10/2009 |
| JP | 2010-114384 | 5/2010 |
| JP | WO 2009/001699 A1 | 8/2010 |
| JP | 5488916 B2 | 5/2014 |
| JP | 2014-170825 A | 9/2014 |
| JP | 2014-175488 A | 9/2014 |
| JP | 2016-76612 | 5/2016 |
| JP | 2016-92080 | 5/2016 |
| JP | 5941655 B2 | 6/2016 |
| JP | 2018-93022 | 6/2018 |
| WO | WO 2015/129490 A1 | 9/2015 |

* cited by examiner

3D-FDTD ELECTRIC FIELD VECTOR

2D-FDTD ELECTRIC FIELD DISTRIBUTION

SUBSTRATE INCLUDING PHOTONIC CRYSTAL AND METHOD FOR MANUFACTURING THE SAME, AND SURFACE EMITTING QUANTUM CASCADE LASER

FIELD

Embodiments described herein relate generally a substrate including photonic crystal and a method for manufacturing the same, and a surface emitting quantum cascade laser.

BACKGROUND

Lasers containing a photonic crystal layer can radiate laser light toward above the active layer.

A surface emitting quantum cascade laser can be manufactured by forming an active layer, a photonic crystal layer, an upper cladding layer, a contact layer, upper electrodes, and the like in that order on a semiconductor substrate. In this case, the photonic crystal layer includes a region that constitutes grating points of a two-dimensional diffraction grating and, surrounding it, a region having a different refractive index.

With a process for manufacturing a surface emitting laser in which holes are provided in the semiconductor layer using a microcutting process to form grating points and then an upper cladding layer, a contact layer, and the like are grown with the holes remaining, the process is complicated and increasing yield is difficult.

DETAILED DESCRIPTION

In general, according to one embodiment, a substrate including a photonic crystal has a compound semiconductor, dielectric layers, and a first semiconductor layer. The dielectric layers are provided on a surface of the compound semiconductor substrate and disposed at each grating point of a two-dimensional diffraction grating, each of the dielectric layers having an asymmetric shape in relation to at least one edge of the two-dimensional diffraction grating and having a refractive index lower than a refractive index of the compound semiconductor substrate. The first semiconductor layer includes a flat first face covering the dielectric layers and the surface of the compound semiconductor substrate, a layer constituting the first face containing a material capable of being lattice matched to a material constituting the compound semiconductor substrate.

Hereinafter, embodiments of the invention will be described below with reference to the drawings.

Figure 1A:
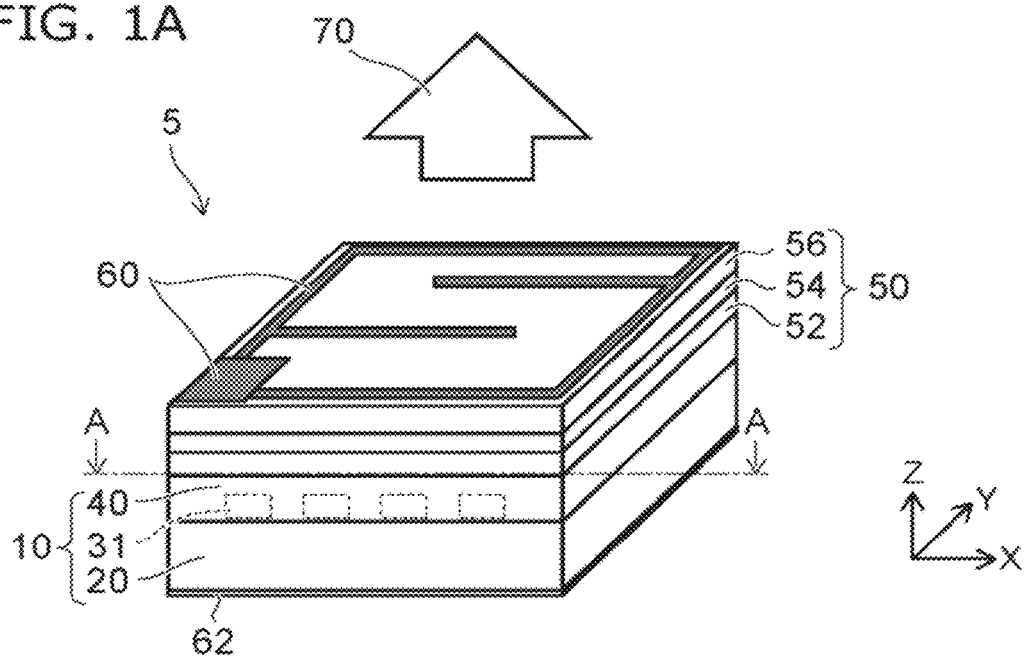
FIG. 1A is a schematic perspective view of a surface emitting quantum cascade laser according to a first embodiment.
Figure 1B:
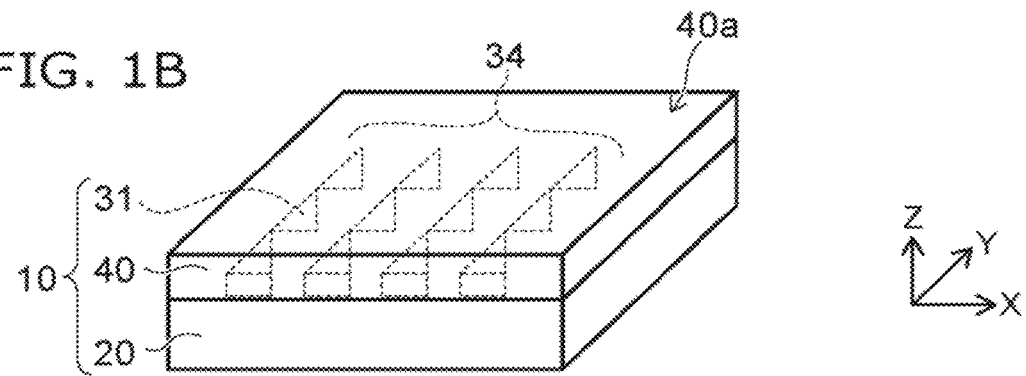
FIG. 1B is a schematic perspective view of a substrate including a photonic crystal used in the first embodiment.

FIG. 1A is a schematic perspective view of a surface emitting quantum cascade laser according to a first embodiment, and FIG. 1B is a schematic perspective view of a substrate including a photonic crystal used in the first embodiment.

As illustrated in FIG. 1B, the substrate including a photonic crystal 10 includes a compound semiconductor substrate 20, dielectric layers 31, and a first semiconductor layer 40.

The dielectric layers 31 are provided on the surface of the compound semiconductor substrate 20, and are each disposed at grating points of a two-dimensional diffraction grating 34. Each of the dielectric layers 31 has an asymmetric shape in relation to at least one edge of the two-dimensional diffraction grating 34. The dielectric layers 31 also have a refractive index lower than the refractive index of the compound semiconductor substrate 20.

The first semiconductor layer 40 includes a flat first face 40a, which covers the dielectric layers 31 and the surface of the compound semiconductor substrate 20. The layer constituting the first face 40a contains a material capable of being lattice matched to the material constituting the compound semiconductor substrate 20.

A surface emitting quantum cascade laser 5 includes at least a substrate including a photonic crystal 10 and an active layer 54. As illustrated in FIG. 1A, the surface emitting quantum cascade laser 5 may further include a semiconductor stacked body 50, upper electrodes 60, and a lower electrode 62.

The semiconductor stacked body 50 may include a lower cladding layer 52, an active layer 54, an upper cladding layer 56, and the like, from the side nearest the substrate including a photonic crystal 10. The semiconductor stacked body 50 is grown on the first face 40a of the substrate including a photonic crystal 10 using metal organic chemical vapor deposition (MOCVD), molecular beam epitaxy (MBE), or the like. In this case, good crystallinity can be obtained by lattice-matching the layer constituting the flat first face 40a and the material constituting the compound semiconductor substrate 20. After that, a surface emitting quantum cascade laser 5 with good crystallinity is obtained by growing the semiconductor stacked body 50 so as to be lattice-matched to the layer constituting the first face 40a.

Note that in the specification, lattice matching of the material of the layer constituting the first face 40a and the material of the compound semiconductor substrate 20 means that the deviation of the lattice constant of the layer constituting the first face 40a is within ±1% relative to the lattice constant of the compound semiconductor substrate 20.

The active layer 54 is provided on the first face of the first semiconductor layer 40 and is capable of emitting laser light 70 by intersubband optical transition. Each of the dielectric layers 31 has an asymmetric shape in relation to at least one edge of the two-dimensional diffraction grating 34, and has a refractive index lower than the refractive index of the compound semiconductor substrate 20. Laser light 70 is emitted in a direction perpendicular to the surface of the active layer 54 as a single-mode transverse magnetic (TM) wave with uniform polarization in a prescribed direction. Furthermore, the wavelength of the laser light 70 is, for example, from infrared light to a terahertz wave.

In the surface emitting quantum cascade laser 5 according to the first embodiment, the upper cladding layer and the contact layer do not have to be grown above the holes or the like of the two-dimensional diffraction grating. For this reason, the manufacturing process is simple. Furthermore, a high-quality beam is easily obtained because the dimensional precision of the two-dimensional diffraction grating can be increased.

Figure 2A:
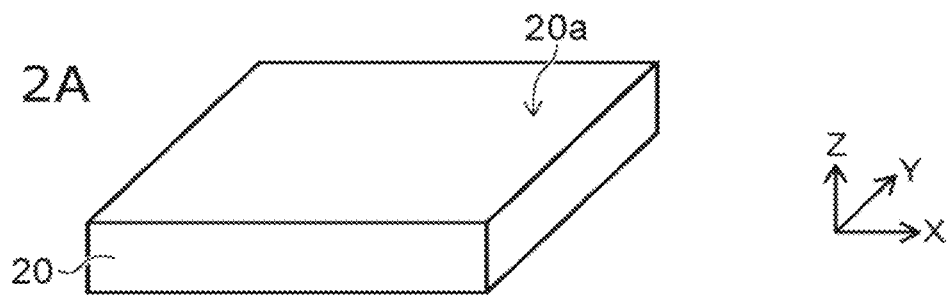
FIGS. 2A to 2D are schematic views for describing the method for manufacturing the substrate including a photonic crystal.
Figure 2B:
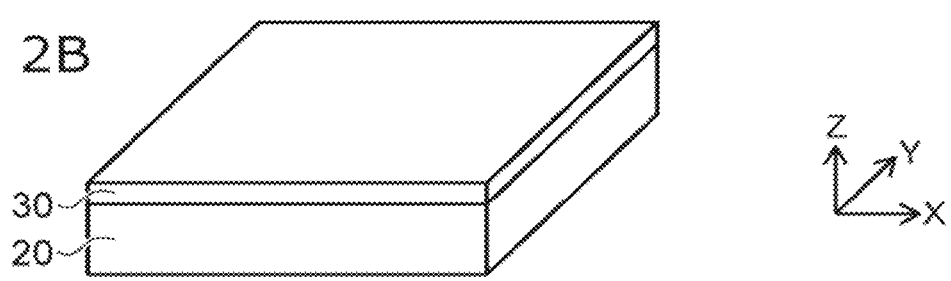
Figure 2C:
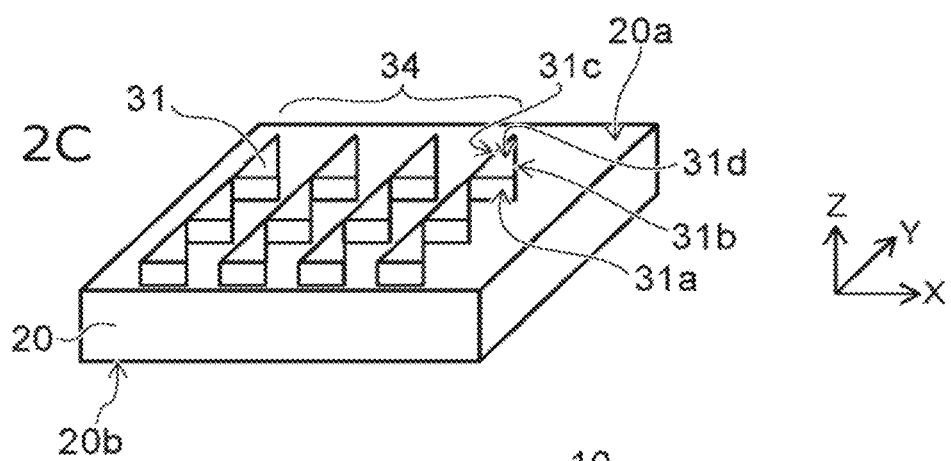
Figure 2D:
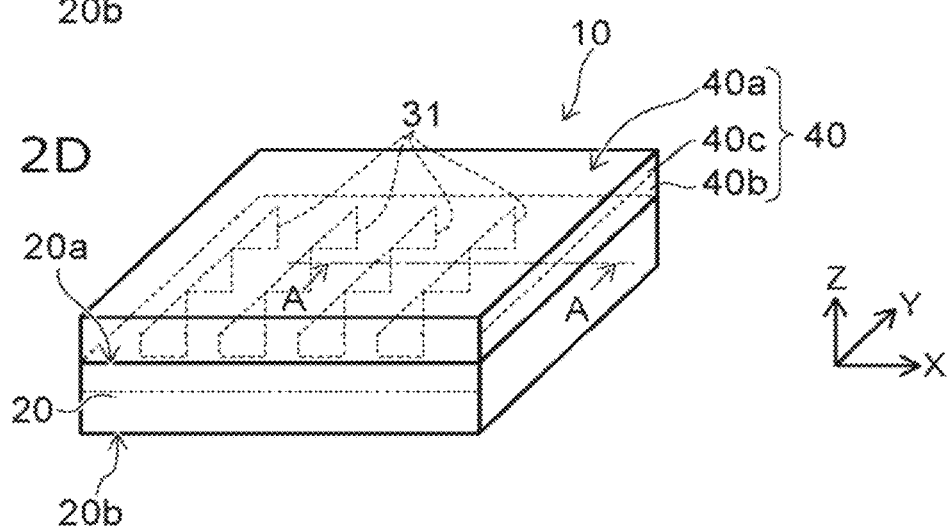

FIGS. 2A to 2D are schematic views for describing the method for manufacturing the substrate including a photonic crystal. Specifically, FIG. 2A is a schematic perspective view of the compound semiconductor substrate; FIG. 2B is a schematic perspective view after formation of a dielectric film on the compound semiconductor substrate; FIG. 2C is a schematic perspective view after patterning of the dielectric film; and FIG. 2D is a schematic perspective view after crystal growth of the first semiconductor layer.

The compound semiconductor substrate 20 illustrated in FIG. 2A may be formed from InP, GaAs, or the like. The thickness thereof in the wafer state is from 100 to 900 μm or the like.

As illustrated in FIG. 2B, the dielectric film 30 is provided on the surface 20a of the compound semiconductor substrate 20, and may be formed from a nitride film, an oxide film, or the like. $Si_3N_4$ or the like may be used as the nitride film, and $SiO_2$ or the like may be used as the oxide film. The dielectric film 30 may be formed using, for example, chemical vapor deposition (CVD), sputtering, electron cyclotron resonance (ECR) sputtering, or the like. The thickness thereof is from 300 nm to 1 μm or the like. For example, the refractive index of $Si_3N_4$ is about 2.0, and the refractive index of $SiO_2$ is about 1.43 or the like. In a case where the compound semiconductor substrate 20 contains InP, the refractive index of the dielectric film 30 is lower than the refractive index of InP (for example, about 3.4).

Photoresist (not illustrated) is spread on the dielectric film 30. Using a mask pattern of the two-dimensional diffraction grating, the photoresist is exposed and the unnecessary portions of the dielectric film 30 are removed. In this manner, the dielectric layers 31 constituting the two-dimensional diffraction grating 34 are formed as illustrated in FIG. 2C. Configuration examples of the two-dimensional diffraction grating will be described in detail later in the specification. The unnecessary portions of the dielectric film 30 can be easily removed by wet etching or dry etching.

As illustrated in FIG. 2D, a first semiconductor layer 40 including a material capable of being lattice matched to the material of the compound semiconductor substrate 20 is regrown on the dielectric layers 31 and the compound semiconductor substrate 20, and the first face 40a is made to be flat and capable of regrowth. When the compound semiconductor substrate 20 is made from n-type InP, the first semiconductor layer 40 is made from n-type InP or a material such as n-type InGaAs, which is capable of lattice matching to InP. For example, n-type InP is regrown from the exposed surface 20a of the compound semiconductor substrate 20 to the height of the dielectric layers 31, to form a selectively grown layer 40b.

Figure 3A:
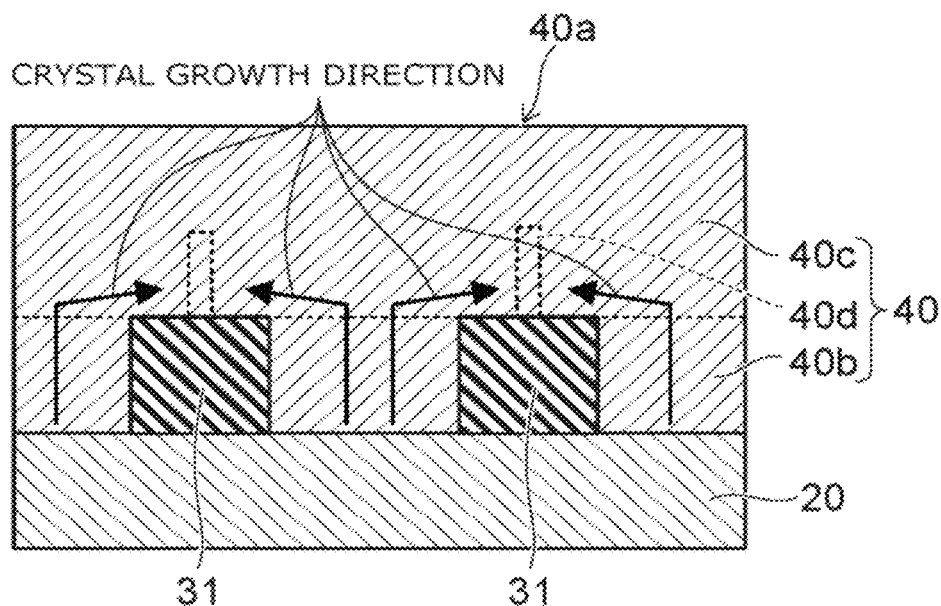
FIG. 3A is a schematic cross-sectional view for describing the crystal growth direction of the first semiconductor layer.
Figure 3B:
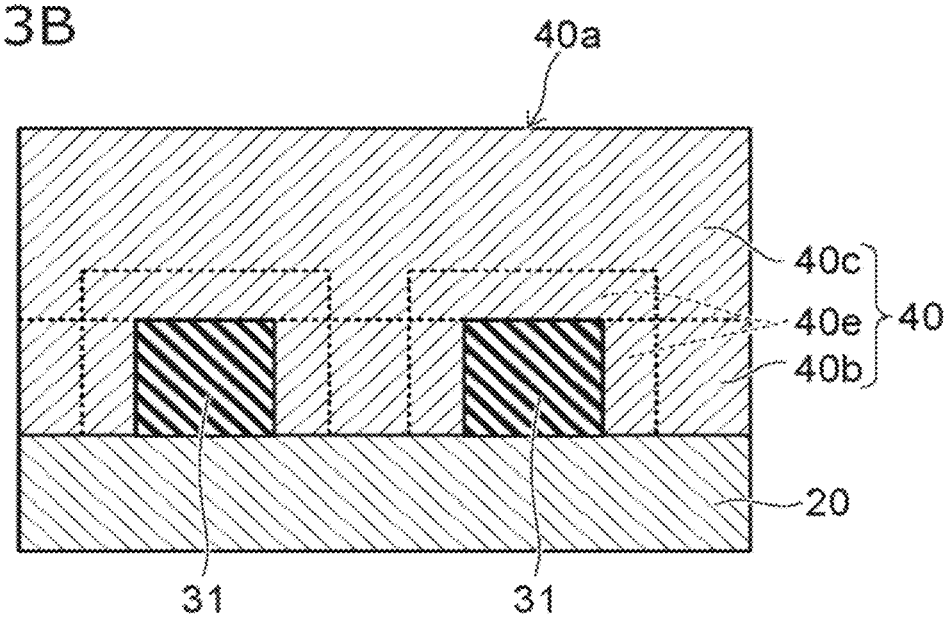
FIG. 3B is a schematic cross-sectional view for describing the boundary region of the dielectric layers and the first semiconductor layer.

FIG. 3A is a schematic cross-sectional view for describing the crystal growth direction of the first semiconductor layer, and FIG. 3B is a schematic cross-sectional view for describing the boundary region of the dielectric layers and the first semiconductor layer.

FIGS. 3A and 3B are schematic cross-sectional views along line A-A in FIG. 2D. In FIG. 3A, crystal growth begins from the surface of the compound semiconductor substrate 20, and the selectively grown layer 40b is further stacked upward from the region of the compound semiconductor substrate 20 between the dielectric layers 31. Note that the crystal growth directions are indicated by arrows. When the thickness of the selectively grown layer 40b reaches the height of the dielectric layers 31, lateral growth proceeds along the surface of the dielectric layers 31. Near the central portion of the upper surface of the dielectric layers 31, the regions that grew laterally from both sides join together, and a domain boundary portion 40d is formed. As crystal growth proceeds further, crystallinity improves and an overgrowth layer 40c, the surface of which has been flattened, is formed.

Performing a polishing or chemical and mechanical polishing (CMP) process on the surface after crystal growth results in an even flatter surface. For this reason, the semiconductor stacked body 50 including the active layer 54 can be regrown while maintaining good crystallinity. The thickness of the first semiconductor layer 40 including the selectively grown layer 40b and the overgrowth layer 40c may be 2 μm or the like.

Furthermore, when the dielectric layers 31 are silicon nitride layers or silicon oxide layers, the silicon pyrolyzed in the crystal growth process diffuses into the first semiconductor layer 31. As a result, the first semiconductor layer 40 includes a region 40e having a silicon concentration that increases toward the dielectric layers 31. It is doped with, for example, from $10^{15}$ to $10^{18}$ $cm^{-2}$ of silicon atoms within a distance of 100 nm from the surface of the dielectric layers 31.

Figure 4A:
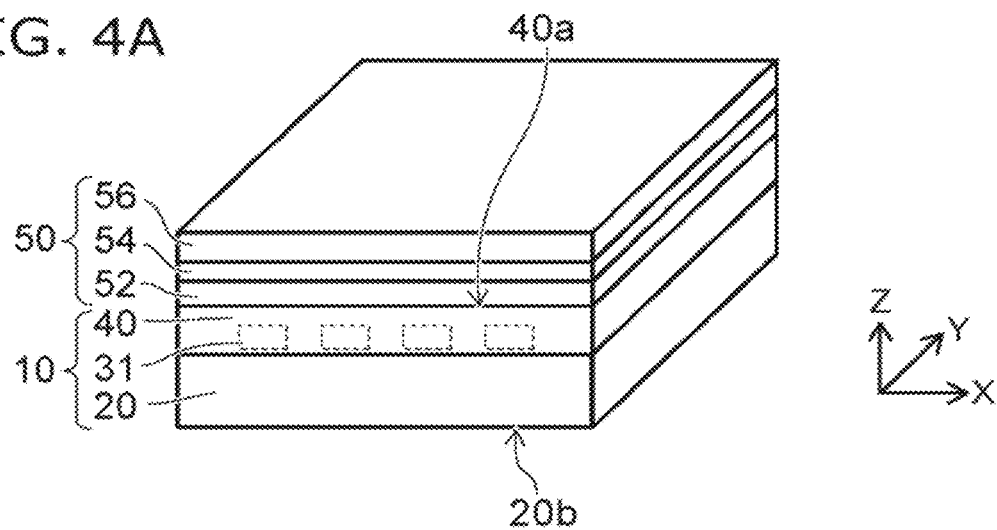
FIGS. 4A and 4B are schematic views for describing a method for manufacturing a surface emitting quantum cascade laser.
Figure 4B:
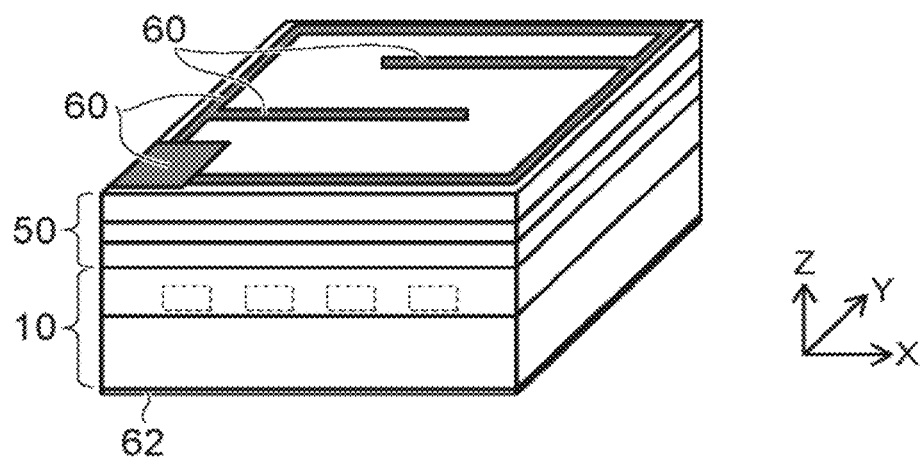

FIGS. 4A and 4B are schematic views for describing a method for manufacturing a surface emitting quantum cascade laser. Specifically, FIG. 4A is a schematic perspective view in which a semiconductor stacked body containing an active layer has been grown on a substrate including a photonic crystal, and FIG. 4B is a schematic perspective view of a surface emitting quantum cascade laser in which upper electrodes and a lower electrode have been formed.

The semiconductor stacked body 50 is regrown on the first face 40a of the first semiconductor layer 40 using MOCVD or MBE. The semiconductor stacked body 50 includes at least a lower cladding layer 52, an active layer 54, and an upper cladding layer 56, from the side nearest the substrate including a photonic crystal 10. The active layer 54 has a structure in which from 30 to 200 unit stacked bodies, containing pairs of a light-emitting quantum well layer and an injection quantum well layer, are stacked.

The semiconductor stacked body 50 may further include a lower light guide layer (not illustrated) provided between the lower cladding layer 52 and the active layer 54, an upper light guide layer (not illustrated) provided between the active layer 54 and the upper cladding layer 56, a contact layer (not illustrated) provided between the upper cladding layer 56 and the upper electrodes 60, and the like. A lower electrode 62 is provided on the rear surface 20b of the compound semiconductor substrate 20.

In cases where the carriers are electrons, the lower cladding layer 52 may contain n-type InP, n-type InAlAs, n-type InGaAs, and the like, and the thickness thereof may be from 2 to 4 μm or the like. Furthermore, the upper cladding layer 56 may contain n-type InP, n-type InAlAs, n-type InGaAs, and the like, and the thickness thereof may be from 2 to 4 μm or the like. Because the lower cladding layer 52 and the upper cladding layer 56 are thick, they are preferably lattice-matched to the layer that constitutes the first face 40a.

The quantum well layer that constitutes the active layer 54 may contain a well layer containing InGaAs and a barrier layer containing InAlAs. The thickness of the active layer 54 in which the unit stacked bodies containing pairs of a light-emitting quantum well layer and an injection quantum well layer are stacked may be from 0.6 to 4 μm or the like.

The semiconductor stacked body 50 containing the active layer 54 may be regrown on the rear surface 20b of the substrate including a photonic crystal 20. In this case, the thickness of the overgrowth layer 40c illustrated in FIG. 2D is thickened to several hundred μm or the like, thereby increasing mechanical strength. Then, it is thinned to not greater than several μm by polishing the side nearest the rear surface of the compound semiconductor substrate 20. Furthermore, the surface of the thin layer may be flattened using a CMP process or the like. The semiconductor stacked body 50 regrown on the rear surface 20b of the compound semiconductor substrate 20 may have higher crystallinity. Since the thickness of the original compound semiconductor substrate 20 is thinned to not greater than several μm, the distance between the active layer 54 and the photonic crystal is short. For this reason, optical resonance by the photonic crystal occurs readily.

Figure 5A:
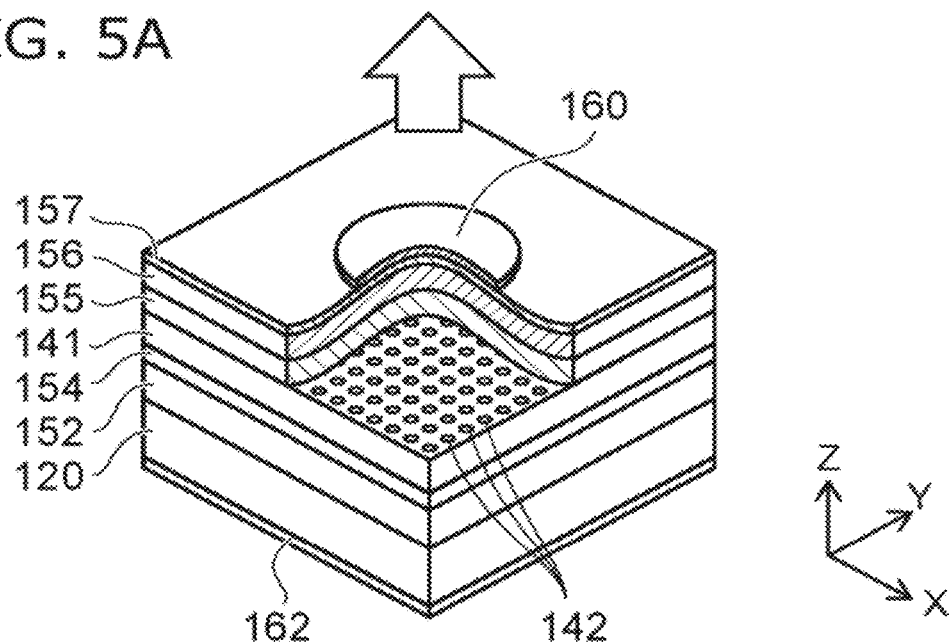
FIG. 5A is a schematic perspective view of a surface emitting quantum cascade laser according to a comparative example.
Figure 5B:
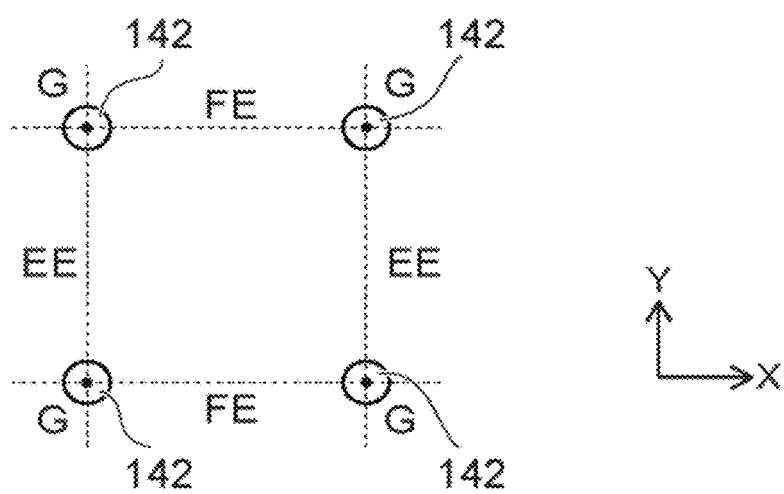
FIG. 5B is a schematic plan view of a comparative example of a two-dimensional diffraction grating.

FIG. 5A is a schematic perspective view of a surface emitting quantum cascade laser according to a comparative example, and FIG. 5B is a schematic plan view of a comparative example of a two-dimensional diffraction grating.

In the surface emitting quantum cascade laser according to the comparative example, at least a lower cladding layer 152, an active layer 154, and a photonic crystal layer 141 are grown in that order on a substrate 120, as illustrated in FIG. 5A. Holes 142 are provided in the photonic crystal layer 141 such that they do not reach the active layer 154. The holes 142 constitute a two-dimensional diffraction grating. On the holes 142, for example, an optical guide layer 155, an upper cladding layer 156, a contact layer 157, and the like are regrown.

The grating points G of square grating of the photonic crystal layer of the comparative example are constituted of a low-refractive-index medium (or including holes) having a circular planar shape.

In the comparative example, microetching on the order of submicrons needs to be performed on the photonic crystal layer 141 made from a semiconductor. After that, the optical guide layer 155, upper cladding layer 156, contact layer 157, and the like needs to be regrown such that they do not bury the holes 142. As a result, the manufacturing process is complicated and increasing yield is not easy.

On the other hand, with a structure in which holes 142 are provided in the top face of the chip, an upper surface 160 needs to be formed on the face provided with the periodic structure shape of the diffraction grating. In this case as well, the manufacturing process is complicated and increasing yield is not easy.

In contrast, in a surface emitting quantum cascade laser 5 according to the first embodiment, the photonic crystal layer is pre-formed on the compound semiconductor substrate 20. Specifically, patterned dielectric layers 31 of silicon nitride or the like, rather than holes, constitute the two-dimensional diffraction grating 34. The process of selective crystal growth on dielectric layers 31 formed by microcutting is easier than the manufacturing process in the comparative example, and yield can be improved.

The two-dimensional diffraction grating that constitutes the photonic crystal will now be described.

Figure 6:
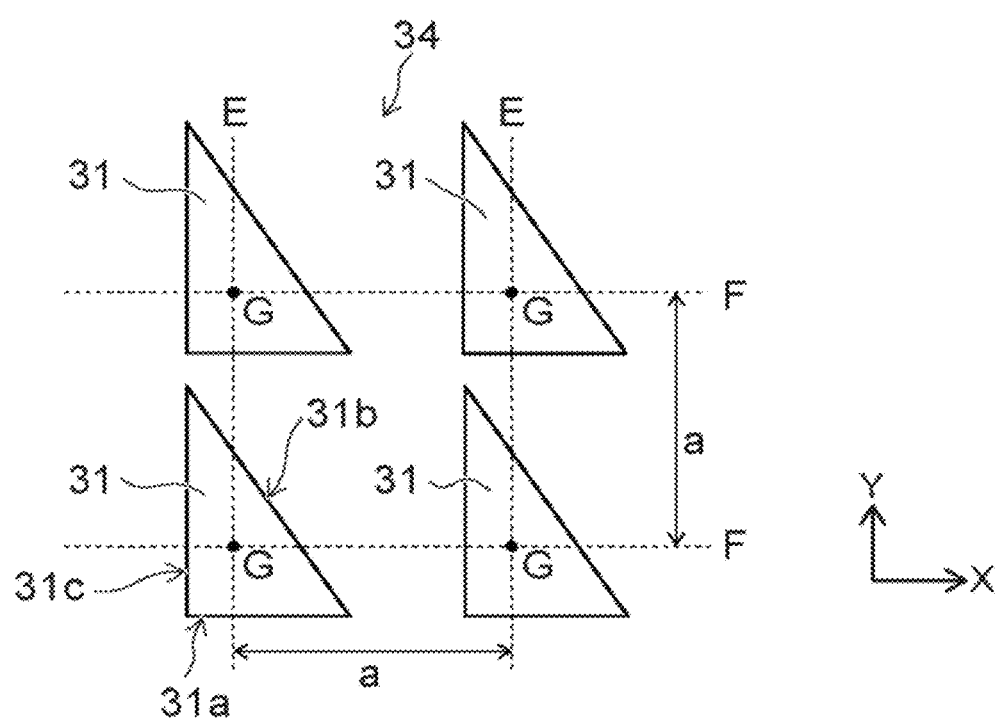
FIG. 6 is a schematic perspective view for describing the configuration of the two-dimensional diffraction grating of the surface emitting quantum cascade laser according to the first embodiment.

FIG. 6 is a schematic perspective view for describing the configuration of the two-dimensional diffraction grating of the surface emitting quantum cascade laser according to the first embodiment.

The two-dimensional diffraction grating 34 is a square grating with a grating spacing represented by "a." The dielectric layers 31, of which the planar shape is, for example, a right triangle, are disposed at the grating points G. In the drawing, the centroid of the right triangle is illustrated so as to be near the grating point G. Note that the shape of the triangle is not limited to a right triangle.

Figure 7A:
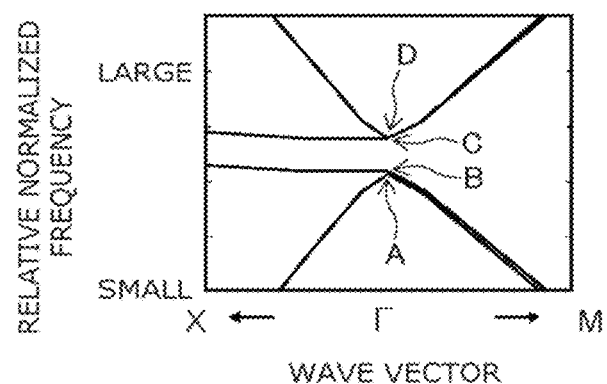
FIG. 7A is a band diagram of a photonic crystal.
Figure 7B:
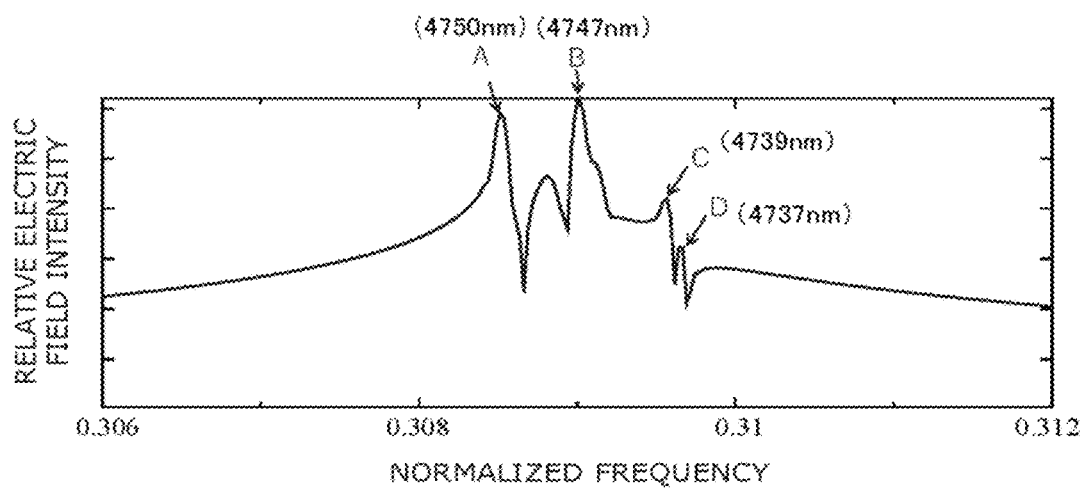
FIG. 7B is a graph for describing examples of laser oscillation modes.

FIG. 7A is a band diagram of a photonic crystal, and FIG. 7B is a graph for describing examples of laser oscillation modes.

In FIG. 7A, the vertical axis represents relative normalized frequency obtained by multiplying the light frequency by a/c, and the horizontal axis represents a wave vector. Note that a is the lattice constant and c is the speed of light. At point Γ of the wave vector, there exist resonance modes A, B, C, D at which the group velocity of light goes to zero.

In FIG. 7B, the vertical axis represents electric field intensity, and the horizontal axis represents normalized frequency. The electric field intensity and the amount of light that leaks in the perpendicular direction are roughly proportional. For this reason, the relative electric field intensity (logarithmic scale) may be considered as corresponding to relative gain. According to a simulation of a surface emitting quantum cascade laser having the diffraction grating of FIG. 6, the relative electric field intensity of resonance mode B, at which the wavelength is 4747 nm, is highest, and the optical confinement effect is high. For this reason, it is preferably oscillated in mode B. Furthermore, mode A may be used because the relative electric field intensity of mode A is higher than the relative electric field intensities of modes C and D.

Figure 8:
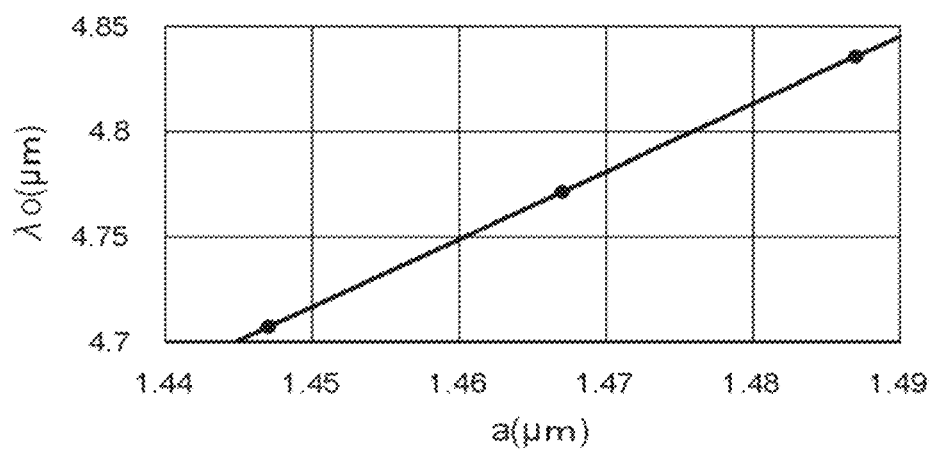
FIG. 8 is a graph illustrating the dependency of in vacuo wavelength on grating spacing.

FIG. 8 is a graph illustrating the dependency of in vacuo wavelength on grating spacing.

The vertical axis represents in vacuo wavelength $\lambda_o$, and the horizontal axis represents grating spacing a. A simulation by the inventors demonstrated that when the dielectric layers 31 include a silicon nitride layer and the periphery thereof is surrounded by InP, the oscillation wavelength $\lambda_o$ and grating spacing a are approximately represented by a linear function. That function may be represented by Equation (1).

$$a\ (\mu m) = -0.0222 + 0.3121\lambda_0 \quad (1)$$

For example, when the grating spacing a is 1.467 μm and the normalized frequency is 0.30746, the in vacuo wavelength $\lambda_0$ is 4.7713. Equation (1) may also be applied in the case of a terahertz wave having an in vacuo wavelength $\lambda_0$ of not less than 70 μm and not greater than 300 μm. Furthermore, when the dielectric layers 31 are buried in a medium having a refractive index of $n_1$, the in-medium wavelength $\lambda_m$ is represented by Equation (2).

$$\lambda_m = \lambda_0/n_1 \quad (2)$$

For example, when the medium is InP, the in-medium wavelength $\lambda_m$ is shorter than the in vacuo wavelength because the refractive index is about 3.4.

In a comparative example, the planar shape of the grating points G is circular, as illustrated in FIG. 5B. For this reason, the shape of the low-refractive-index layer that constitutes the grating points G is symmetric in relation to two edges EE and FF of the square grating, and is isotropic relative to the light. Thus, the electromagnetic near-field distribution may sometimes rotate within the low-refractive-index layer and become radial. In this case, the electromagnetic far-field distribution of light coming out at the top of the chip, for example, in mode A, rotates around the upper electrode 160, and in mode B, becomes radial centered around the upper electrode 160. For this reason, the polarizing direction at the chip surface is non-uniform in a certain direction, and increasing output is difficult.

In contrast, in the first embodiment, as illustrated in FIG. 6, the two edges that form the right angle are respectively parallel to the two edges E and F of the square grating, and the respective dielectric layers 31 have an asymmetric shape in relation to edges E and F of the two-dimensional diffraction grating 34. Such a two-dimensional diffraction grating 34 has optical anisotropy.

Figure 9A:
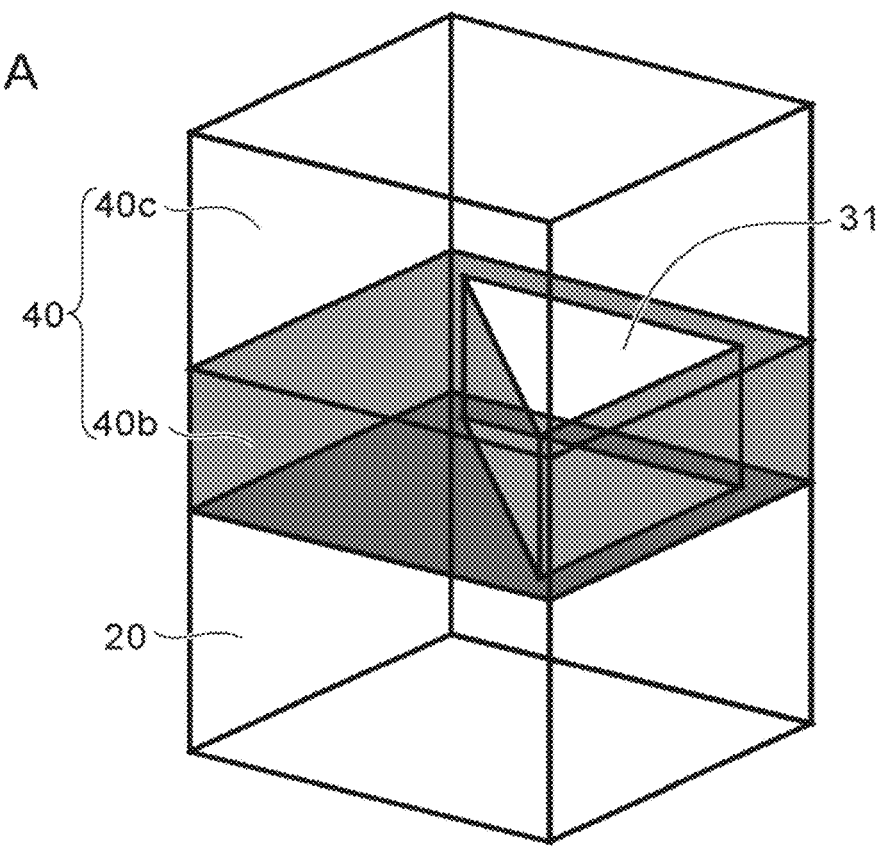
FIG. 9A is a schematic perspective view for describing the shape of the grating points in the first embodiment.
Figure 9B:
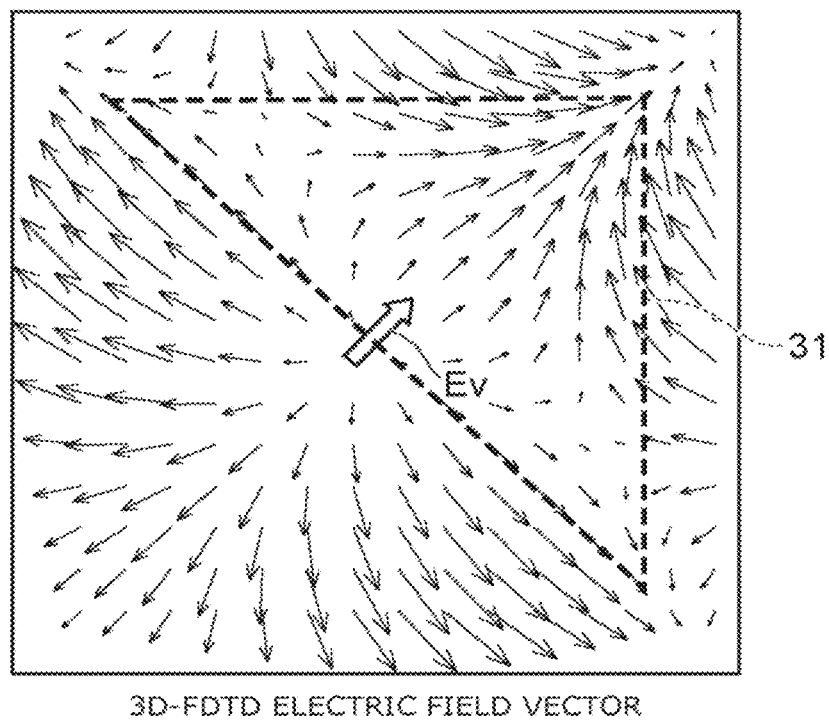
FIG. 9B is a diagram illustrating the electric near-field vector distribution near point Γ.

FIG. 9A is a schematic perspective view for describing the shape of the grating points in the first embodiment, and FIG. 9B is a diagram illustrating the electric near-field vector distribution near point Γ.

FIG. 9B illustrates the electric field vector distribution (in the XY plane) analyzed using the 3D-FDTD (three-dimensional finite difference time domain) method. In the XY plane, in a case where there is polarization of the electric field due to asymmetry in the region of the dielectric layer 31 (in a case where integration in the region does not result in zero), light leaks in the Z-axis direction. As illustrated in FIG. 9A, when the dielectric layer 31 is an isosceles right triangle, the electric field vector of radiant light emitted upward in the Z-axis direction is expressed as $E_V$. Note that a schematic plan view of the dielectric layer 31 is represented by the dashed lines in FIG. 9B.

Figure 10:
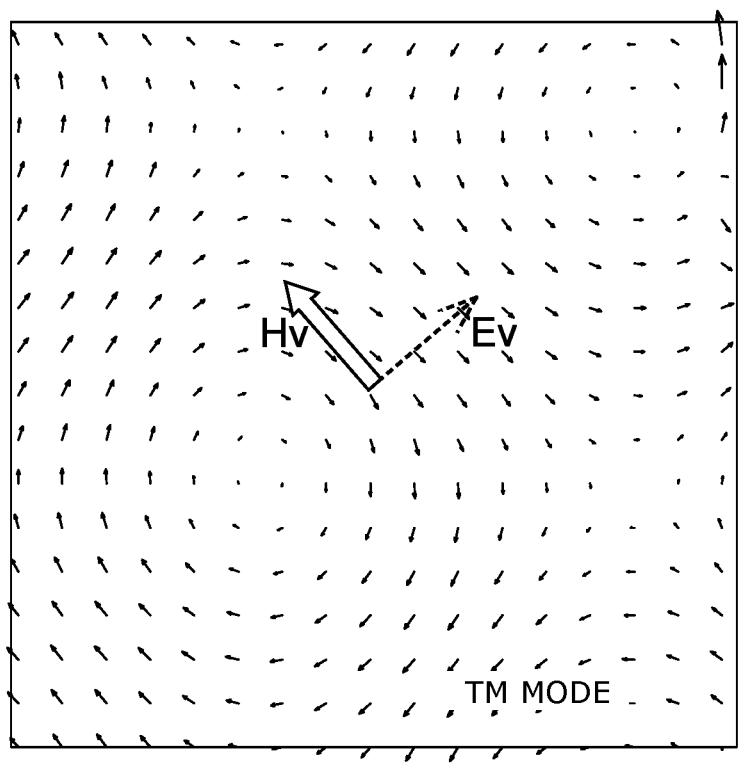
FIG. 10 is a diagram illustrating the electromagnetic field corresponding to mode B in the first embodiment.

FIG. 10 is a diagram illustrating the electromagnetic field corresponding to mode B in the first embodiment.

FIG. 10 illustrates the electric field vector distribution (in the XY plane) of mode B analyzed using the 2D-FDTD (two-dimensional finite difference time domain) method. The laser light 70 from the quantum cascade laser is a TM wave. For this reason, the direction of the magnetic field vector $H_V$ is uniform in a prescribed direction due to optical anisotropy. For this reason, the surface emitting quantum cascade laser 5 can emit a TM wave containing the linear polarized magnetic field vector $H_V$ toward the top of the chip. As a result, even in a case where the chip size is increased, high-output laser light can be obtained because a stable polarization direction can be maintained.

Figure 11A:
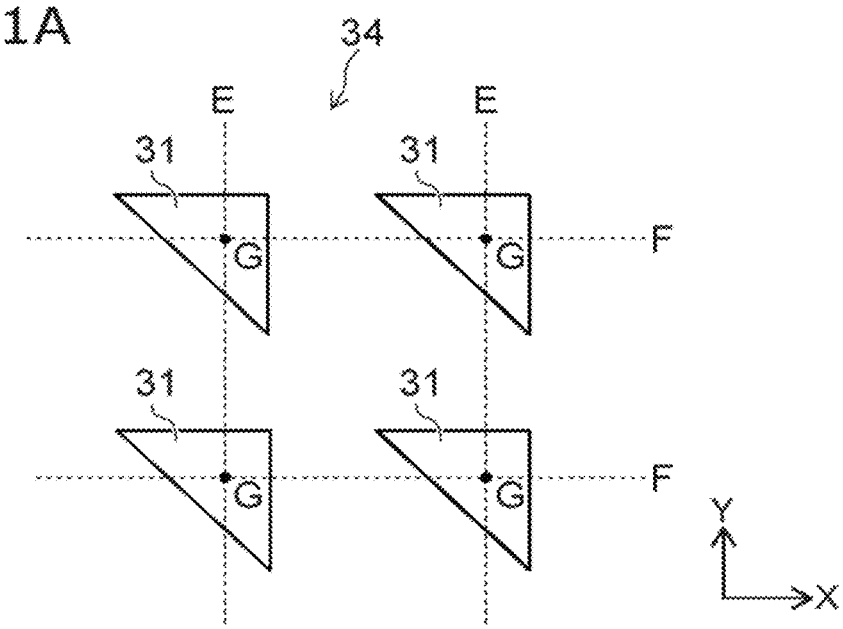
FIG. 11A is a schematic plan view of a first variation of a two-dimensional diffraction grating.
Figure 11B:
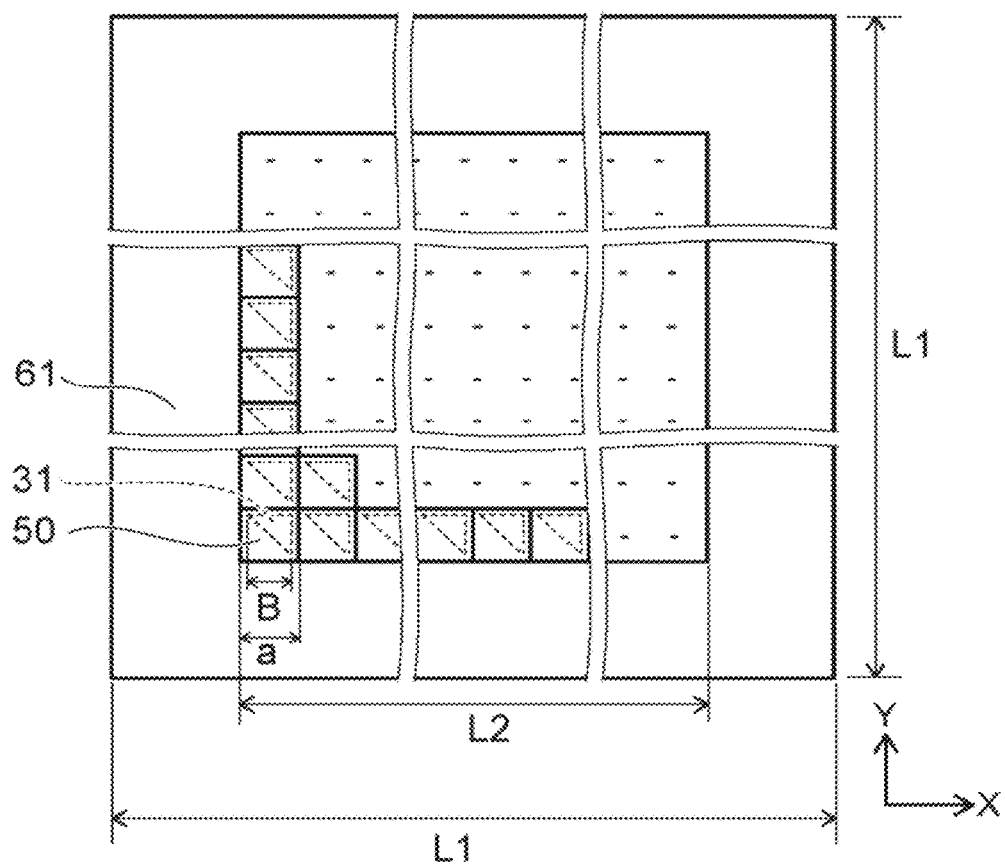
FIG. 11B is a schematic plan view illustrating an example of the arrangement of two-dimensional diffraction gratings of one chip.

FIG. 11A is a schematic plan view of a first variation of a two-dimensional diffraction grating, and FIG. 11B is a schematic plan view illustrating an example of the arrangement of two-dimensional diffraction gratings of one chip.

As illustrated in FIG. 11A, the two-dimensional diffraction grating 34 constitutes a square grating. The shape of the dielectric layers 31 is not limited to a triangular prism, and may be a right isosceles triangular pyramid or the like. The upper electrodes 61 are provided, for example, in the form of a frame on the upper surface of the chip. Table 1 gives an example of the numeric values of the planar shape of a chip.

TABLE 1

| Oscillation wavelength λ (μm) | a (Unit border) | B (Triangular pyramid size) | W Number of repetitions |
|---|---|---|---|
| 4.10 | 1.257 | 1.089 | 206 |
| 4.15 | 1.273 | 1.103 | 204 |
| 4.20 | 1.289 | 1.117 | 201 |
| 4.25 | 1.304 | 1.130 | 199 |
| 4.30 | 1.320 | 1.144 | 196 |
| 4.35 | 1.335 | 1.157 | 194 |
| 4.40 | 1.351 | 1.171 | 192 |
| 4.45 | 1.367 | 1.185 | 190 |
| 4.50 | 1.382 | 1.198 | 188 |
| 4.55 | 1.398 | 1.212 | 185 |

In Table 1, the wavelength is from 4.1 to 4.55 μm. The edge length L1 of the chip is 400 μm or the like. The edge length L2 of the region in which the two-dimensional diffraction grating 34 is provided is 260 μm or the like. The grating spacing is taken as a, the length of the two edges forming the right angle of the dielectric layers 31 is taken as B, and the number of repetitions of the unit is taken as W.

In such a case, light shielding by the upper electrodes 61 can be suppressed. For this reason, high light output is obtained. FIG. 11B illustrates an example using the medium/far infrared wavelength band, but the terahertz wavelength band may also be used. In that case, the grating spacing may be not greater than 50 μm.

Figure 12A:
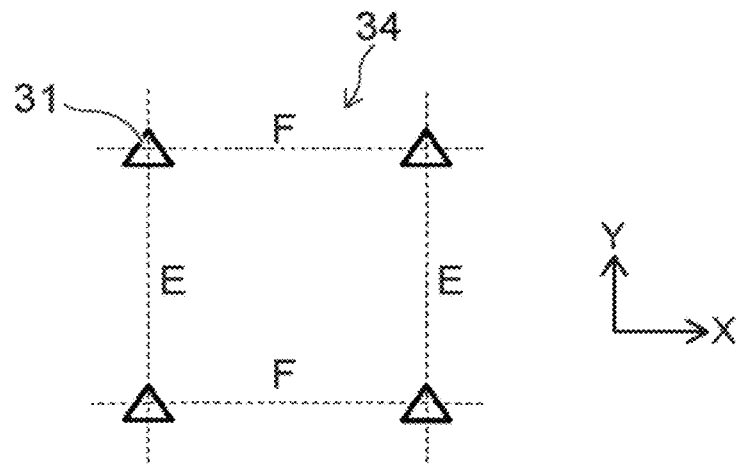
FIG. 12A is a schematic plan view of a second variation of a two-dimensional diffraction grating.
Figure 12B:
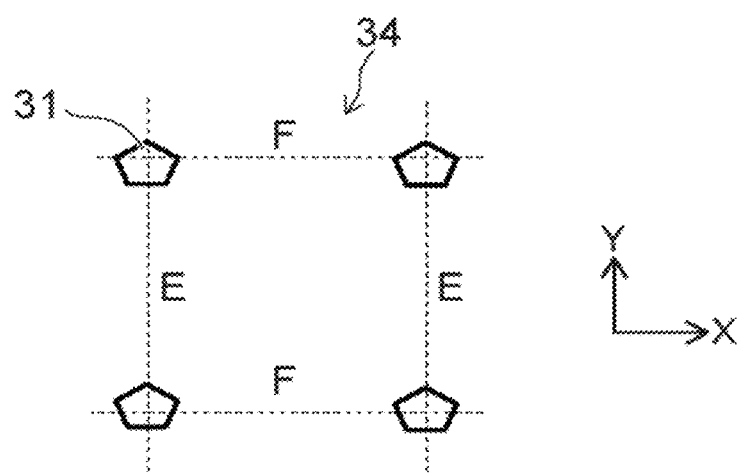
FIG. 12B is a schematic plan view of a third variation of a two-dimensional diffraction grating.
Figure 12C:
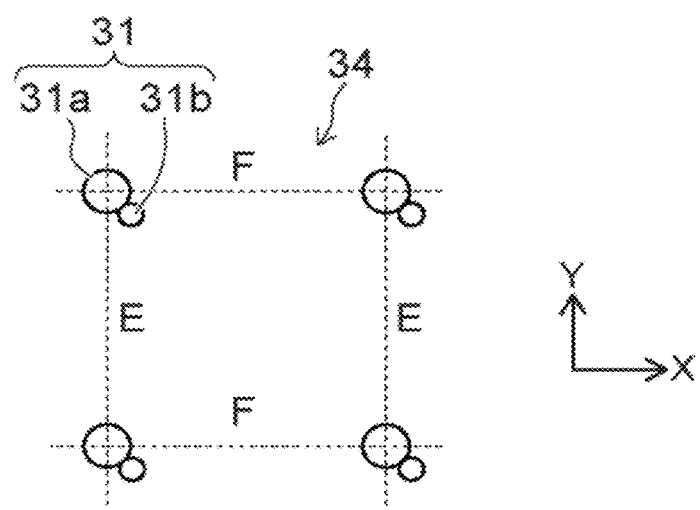
FIG. 12C is a schematic plan view of a fourth variation of a two-dimensional diffraction grating.

FIG. 12A is a schematic plan view of a second variation of a two-dimensional diffraction grating, FIG. 12B is a schematic plan view of a third variation of a two-dimensional diffraction grating, and FIG. 12C is a schematic plan view of a fourth variation of a two-dimensional diffraction grating.

FIGS. 12A to 12C illustrate square gratings, but may also be orthogonal gratings. The shape of the dielectric layers 31 is asymmetric in relation to edge F of any of the square gratings. As illustrated in FIGS. 12A and 12B, the shape of the dielectric layers 31 is not limited provided that it is asymmetric in relation to the edge F of the two-dimensional diffraction grating 34. For example, the shape of the dielectric layers 31 may be an N-sided prism (where N is an odd number), or the like.

Furthermore, as illustrated in FIG. 12C, the dielectric layers 31 may include two dielectric layers 31a and 31b and may be asymmetric in relation to at least one of edges E and F of the two-dimensional diffraction grating 34.

Figure 13A:
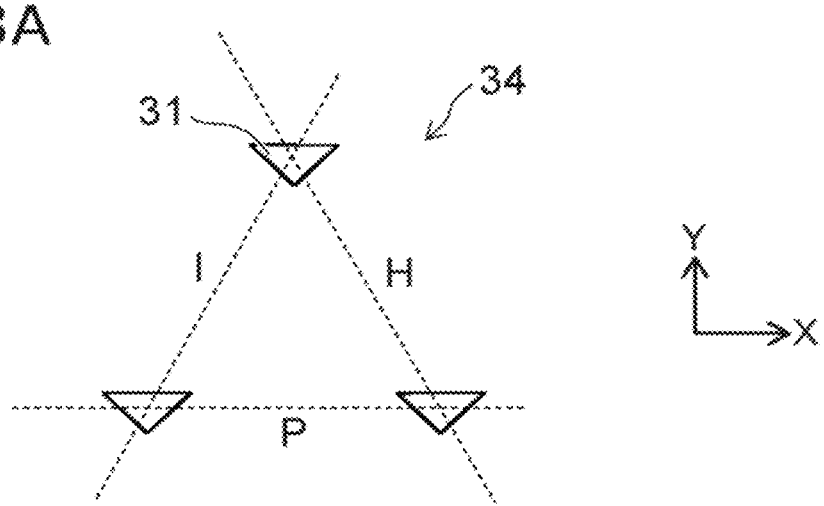
FIGS. 13A and 13B are schematic plan views of two-dimensional diffraction gratings containing triangular gratings.
Figure 13B:
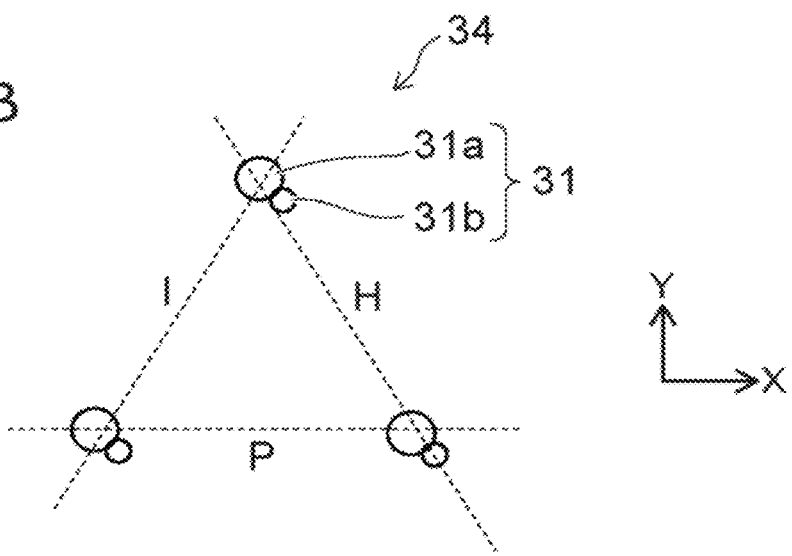

FIGS. 13A and 13B are schematic plan views of two-dimensional diffraction gratings containing triangular gratings.

In FIG. 13A, the dielectric layers 31 are triangular prisms, and in FIG. 13B, the dielectric layers 31 include two round prisms (31a, 31b). The planar shape of the dielectric layers 31 is asymmetric in relation to at least one among edges P, H, and I of the triangular grating.

According to the embodiment, provided are a substrate including a photonic crystal including a two-dimensional diffraction grating by which polarization direction control is easy, and a method for manufacturing the same. Furthermore, provided is a surface emitting quantum cascade laser capable of polarization direction control of TM waves and is also highly suited to mass production. The surface emitting quantum cascade laser according to the embodiment can emit high-output laser light even when chip size is increased because the polarization direction of the TM wave is stable. For this reason, it can be widely used in gas analysis, environmental measurements, laser processing, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a substrate on which a semiconductor stacked body including an active layer of a quantum cascade laser is regrown, the method comprising:

on a surface of a compound semiconductor substrate, forming a dielectric film including a nitride film or an oxide film and having a refractive index lower than the refractive index of the compound semiconductor substrate;

patterning the dielectric film and forming dielectric layers constituting grating points of a two-dimensional diffraction grating, such that each of the dielectric layers has an asymmetric shape in relation to at least one edge of the two-dimensional diffraction grating;

on the surface of the compound semiconductor substrate and on the dielectric layers, growing a first semiconductor layer having a flat surface, such that a deviation of lattice constant of the first semiconductor layer is within ±1% to a lattice constant of a material of the compound semiconductor substrate, and flattening the first semiconductor layer by chemical and mechanical polishing process, such that a further flattened surface is made to be a regrowth starting surface of the semiconductor stacked body.

2. The method according to claim 1, wherein the first semiconductor layer includes a region having a silicon concentration increasing toward the dielectric layers.

3. The method according to claim 1, wherein the material of the compound semiconductor substrate is the same as the material of the layer constituting the of the first semiconductor layer.

4. The method according to claim 1, wherein the compound semiconductor substrate contains InP, and the first semiconductor layer contains InP or InGaAs.

* * * * *